US006884943B1

(12) United States Patent
Gonzalez et al.

(10) Patent No.: US 6,884,943 B1
(45) Date of Patent: *Apr. 26, 2005

(54) I/C PACKAGE/ THERMAL-SOLUTION RETENTION MECHANISM WITH SPRING EFFECT

(75) Inventors: Carlos A. Gonzalez, Chandler, AZ (US); Leo Ofman, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/633,940

(22) Filed: Aug. 4, 2003

Related U.S. Application Data

(63) Continuation of application No. 09/733,476, filed on Dec. 8, 2000, now Pat. No. 6,657,131.

(51) Int. Cl.[7] .............................................. H05K 1/16
(52) U.S. Cl. ...................................... 174/260; 174/250
(58) Field of Search ............................... 361/790, 803, 361/707–711; 174/255–260, 250; 257/700–704, 257/685–686, 774–778, 718–719; 439/63–74

(56) References Cited

U.S. PATENT DOCUMENTS

| 4,611,869 A | 9/1986 | Bonnefoy | 399/75 MP |
| 5,262,925 A | 11/1993 | Matta et al. | 361/783 |
| 5,528,462 A * | 6/1996 | Pendse | 361/767 |
| 5,770,891 A | 6/1998 | Frankeny et al. | 257/727 |
| 5,772,451 A | 6/1998 | Dozier, II et al. | 439/70 |
| 5,823,083 A | 10/1998 | Obertegger et al. | 83/175 |
| 6,375,475 B1 | 4/2002 | Brodsky | 439/66 |
| 6,616,327 B1 * | 9/2003 | Kearney et al. | 366/340 |

* cited by examiner

Primary Examiner—Kamand Cuneo
Assistant Examiner—Tuan Dinh
(74) Attorney, Agent, or Firm—Schwegman, Lundberg, Woessner & Kluth, P.A.

(57) ABSTRACT

A thin, lightweight retention mechanism with a spring force holds an integrated circuit package to a circuit board. The retention mechanism consists of a pressure plate, a backing plate, and a fastening means for applying a deforming force to the plates, such as screws and nuts. The plates are paraboloid or dish-shaped and made of an elastically deformable material, such as steel. The fastening means simultaneously applies deforming forces to the peripheries of the plates to create a continuous spring force to effect electrical continuity between the integrated circuit package and the circuit board. In addition, a method of testing the retention mechanism and a method of assembling the retention mechanism are disclosed.

15 Claims, 9 Drawing Sheets

I/C PACKAGE/ THERMAL-SOLUTION RETENTION MECHANISM WITH SPRING EFFECT

This application is a continuation of U.S. patent application Ser. No. 09/733,476, filed Dec. 8, 2000, now issued as U.S. Pat. No. 6,657,131, which is incorporated herein by reference.

TECHNICAL FIELD OF THE INVENTION

Generally, the present invention relates to electronics packaging and, in particular, the present invention relates to a retention mechanism for mounting an integrated circuit package to a circuit board.

BACKGROUND

Today there is an increased demand for lightweight and thin electronic devices. This demand has encouraged inventors to look for ways to eliminate or reduce heavy and thick components in electronics packaging. One part of electronics packaging is mounting an integrated circuit to a circuit board. Traditionally, an integrated circuit package was mounted to a circuit board by inserting pins on the integrated circuit package into holes on a connector and then attaching the connector to a circuit board. As the number of pins on integrated circuit packages increases and available space decreases, it is more difficult to insert leads or wires through holes and it requires loose wires and solder.

Traditionally, flat, heavy, and thick plates were used to apply high loads to connectors. The high loads are sometimes necessary to get low contact resistance, which provides good conductivity from the integrated circuit to the circuit board. As a result of the high loads, some connectors and circuit boards warped and were rendered useless. Traditionally, very heavy and thick backing plates were used to try to prevent warping. This is not acceptable for the lightweight and thin devices consumers demand today.

For the reasons stated above, and for other reasons stated below which will become apparent to those skilled in the art upon reading and understanding the present specification, there is a significant need in the art for a thin, lightweight retention mechanism with a spring force to hold an integrated circuit package to a circuit board.

DETAILED DESCRIPTION

Figure 1:
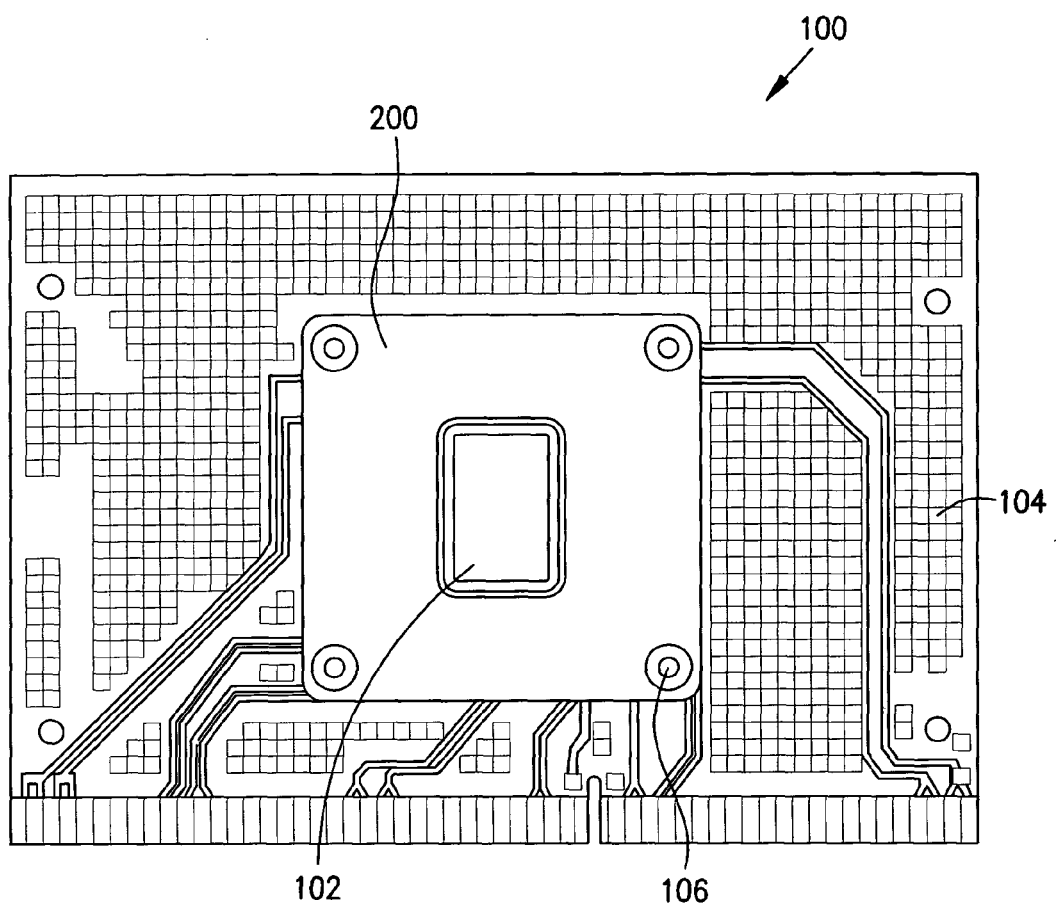
FIG. 1 shows a top view of one embodiment of the present invention.

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

FIG. 1 shows a top view of one embodiment of the present invention. (For a bottom view, see FIG. 3.) One embodiment of the present invention is a retention mechanism 100 for mounting an integrated circuit package 102 to a circuit board 104. The retention mechanism 100 comprises a pressure plate 200, a backing plate 400, and a means for applying forces to the plates 106. (The backing plate 400 is shown in the bottom view of FIG. 3.) The integrated circuit package 102 is held and retained to the circuit board 104 by a continuous spring force. The shape of the plates provides a continuous spring force regardless of the variation of the stack-up with time. The retention mechanism 100 is extremely robust and responsive to expansion and contractions of the materials produced by temperature excursions and mechanical loads.

The integrated circuit package 102 may contain a microprocessor, an application-specific integrated circuit (ASIC), a cache memory, a main memory, other integrated circuit (IC), or multiple electronic products. The integrated circuit package 102 may be any type of package, such as a plastic quad flat pack (PQFP), a Swiss outline package (SOP), a Swiss outline J-leaded (SOJ), a small outline IC (SOIC), a plastic leaded chip carrier (PLCC), a thin quad flat pack (TQFP), a thin small outline package (TSOP), a direct chip attach on a printed circuit board (DCAPCB), a chip scale package (CSP), a tape carrier package (TCP), a plastic pin grid array (PPGA), a ceramic pin grid array (CPGA), a plastic ball grid array (PBGA), a ceramic ball grid array (CBGA), a tape ball grid array (TBGA), a metal ball grid array (MBGA), or an area-array solder-bumped flip-chip technology.

Figure 2:
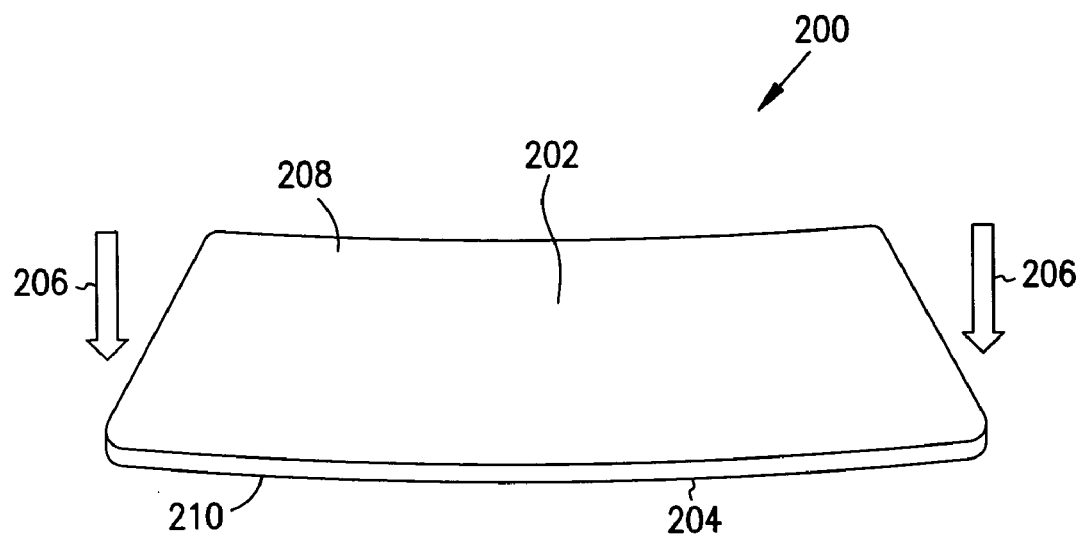
FIG. 2 shows a top view of one embodiment of a pressure plate.

FIG. 2 shows a top view of one embodiment of a pressure plate 200. In one embodiment, the pressure plate 200 is a dish-shaped elastically deformable plate that has an apex (also referred to as a summit) 202 and a periphery 204. The pressure plate 200 may be deformed by applying a force 206 at the periphery 204, resulting in a force generally directed towards the apex 202. The force 206 is preferentially directed towards the apex 202 to avoid warping the circuit board 104.

Figure 3:
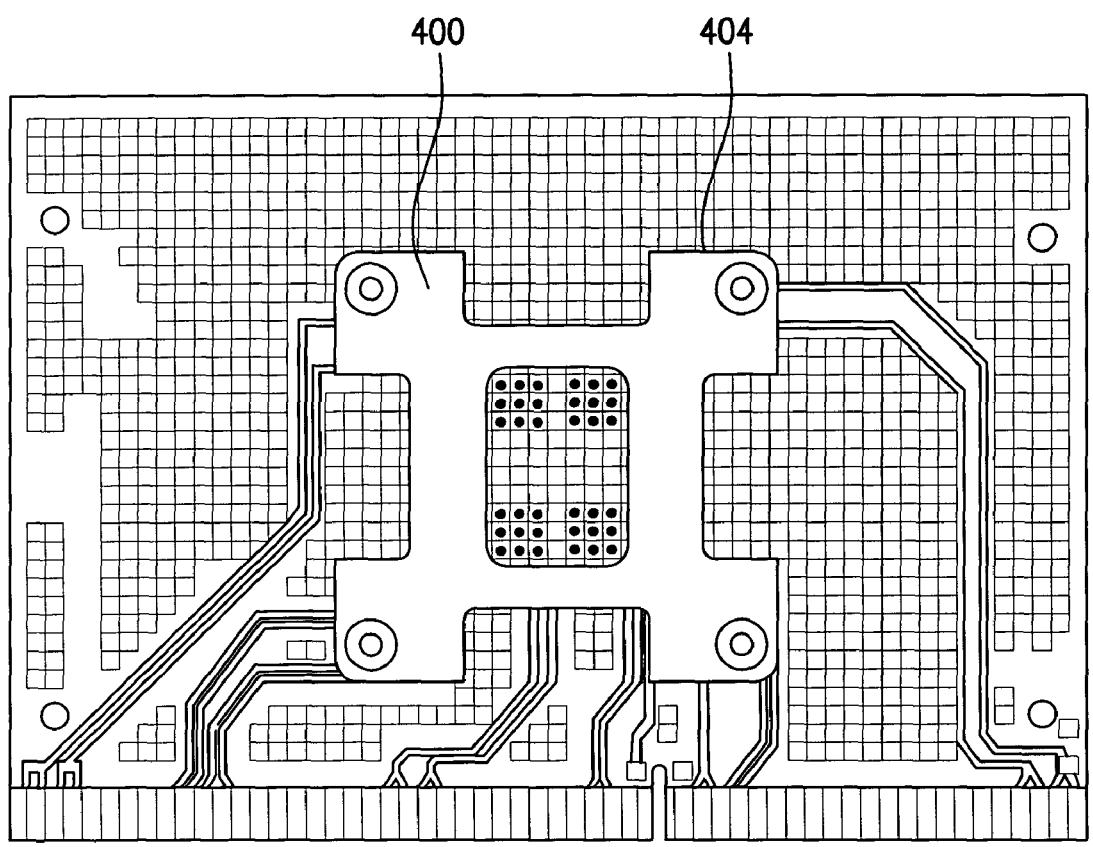
FIG. 3 shows a bottom view of one embodiment of the present invention.

FIG. 3 shows a bottom view of one embodiment of the present invention. In FIG. 3, a backing plate 400 is shown with an irregularly shaped periphery 404. In one embodiment, the periphery 404 of the backing plate 400 or the pressure plate 200 may be fractal-shaped. In one embodiment, the backing plate 400 is in contact with a circuit board 104 where additional components are attached to its back side after the integrated circuit package 102 has been mounted to the circuit board 104. In this case, the fractal-shaped periphery 404 enables or facilitates their attachment.

Figure 4:
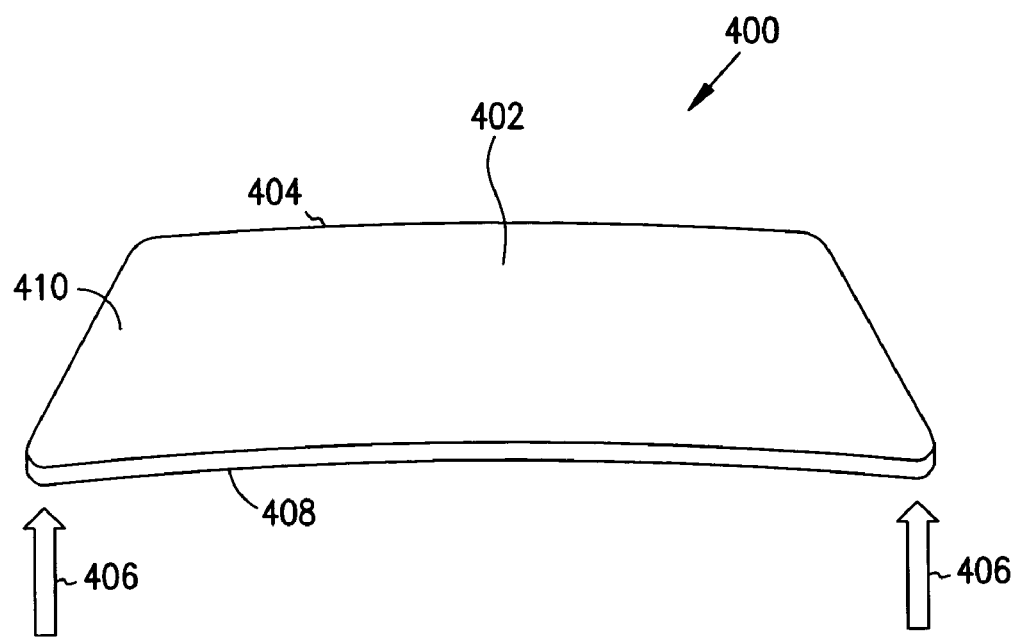
FIG. 4 shows a top view of one embodiment of a backing plate.

FIG. 4 shows a top view of one embodiment of a backing plate 400, which is similar to the pressure plate 200 in FIG. 4. Like the pressure plate 200, the backing plate 400 is a dish-shaped, elastically deformable plate that has an apex 402 and a periphery 404. The backing plate 400 may also be deformed by applying a force 406 at the periphery 404, resulting in a force generally directed towards the apex 402. Once the retention mechanism 100 is assembled, the backing plate 400 acts as a loaded spring providing a constant load over the life of the product. Both the pressure plate 200 and the backing plate 400 are made from a material selected from the group consisting of beryllium copper and steel. These materials have a modulus to provide a large spring force, even with a lightweight and thin mechanism.

Figure 5:
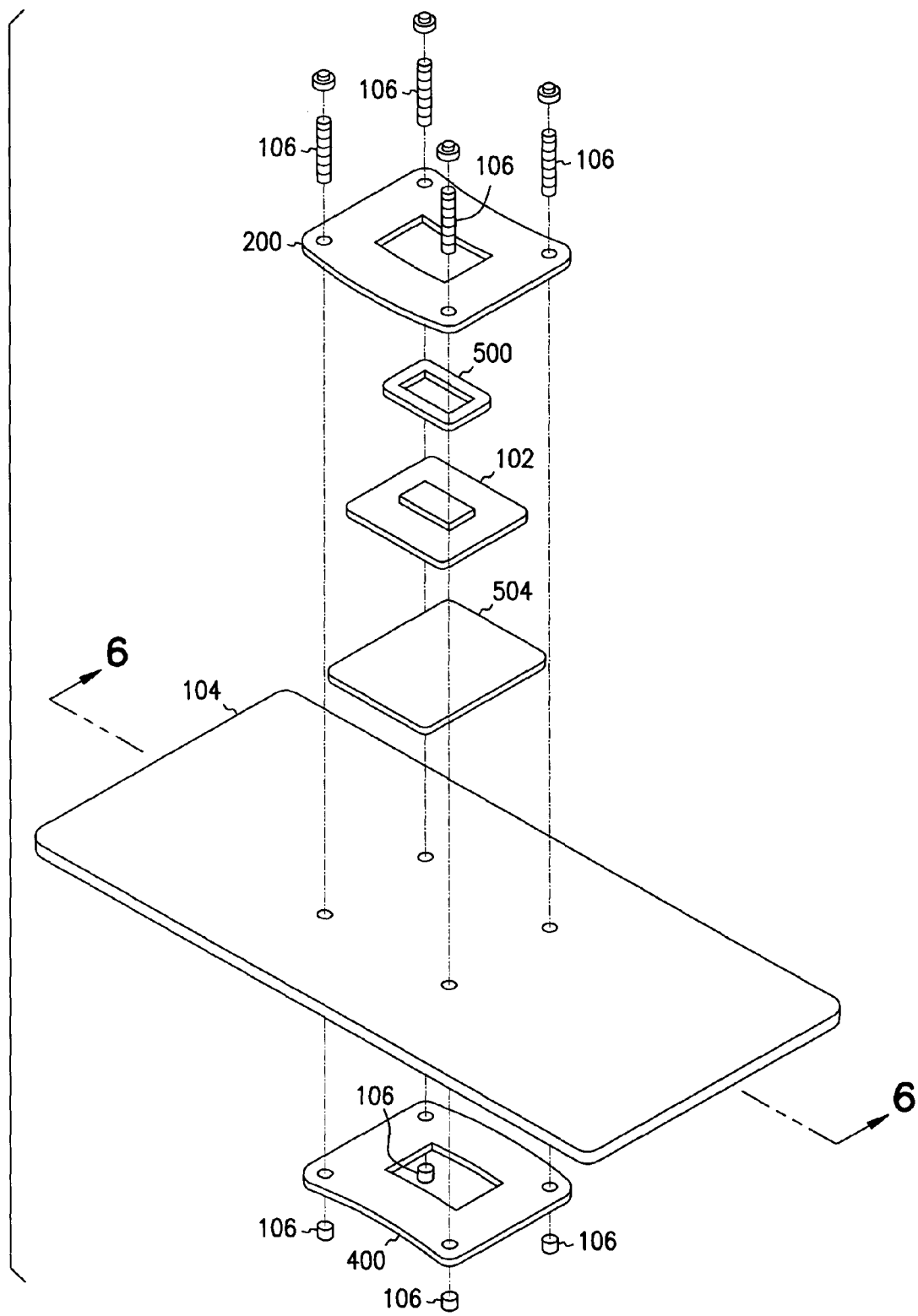
FIG. 5 shows an exploded view of one embodiment of the present invention.

The pressure plate 200 and the backing plate 400 may be similarly shaped, but are oriented differently in the present invention, as shown in FIG. 5. FIG. 5 shows an exploded view of one embodiment of the present invention. In FIG. 5, the pressure plate 200 curves upward, while the backing plate 400 curves downward. Both have their convex surfaces inward. (See FIG. 2, element 210 and FIG. 4, element 408). The shape of the plates helps create a spring force in the retention mechanism 100. The force 206 on the pressure plate 200 and the force 406 on the backing plate 400 are applied simultaneously to the periphery 204 of the pressure plate 200 and the periphery 404 of the backing plate. These deforming forces engage the apex 202 of the pressure plate 200 with a surface of the integrated circuit package 102 and engage the apex 402 of the backing plate 400 with a surface of the circuit board 104. A means 106 for applying the deforming forces is shown in FIG. 5 as threaded studs with nuts, but could be any fastener, such as screws, c-clamps, and the like. Thus, the pressure plate 200 and the backing plate 400 keep a sandwich of components together. For example, as the screws are tightened, the deformation of the plates will start transferring a load to the sandwich. As a result, there is continuous electrical conductivity between the integrated circuit package 102 and the circuit board 104. In one embodiment, an average contact resistance between the integrated circuit package 102 and the circuit board 104 is less than about 50 milliohms, preferably about 13 milliohms.

This sandwich of components, shown in FIG. 5 may additionally include a gasket 500 and a connector 504, in some embodiments of the present invention. The gasket 500 is positioned between the pressure plate 200 and the integrated circuit package 102. The gasket 500 is made of an elastically deformable material, such as an elastomer sheet. The gasket 500 helps to distribute the spring force evenly across the contacts of the integrated circuit package 102 and the circuit board 104. The gasket also helps prevent damage to the integrated circuit package 102. In one embodiment, the gasket has a height of less than about 2 millimeters, preferably less than about 1 millimeter. The connector 504 is interposed between the integrated circuit package 102 and the circuit board 104. The connector 504 may be, a ball grid array, a land grid array, chip scale package, or any other type of connecting device or gasket. In one embodiment, the connector 504 has a height less than about 2 millimeters, preferably less than about 1 millimeter. In one embodiment, the integrated circuit package 102 is pinless and the connector 504 is without pin holes.

Figure 8:
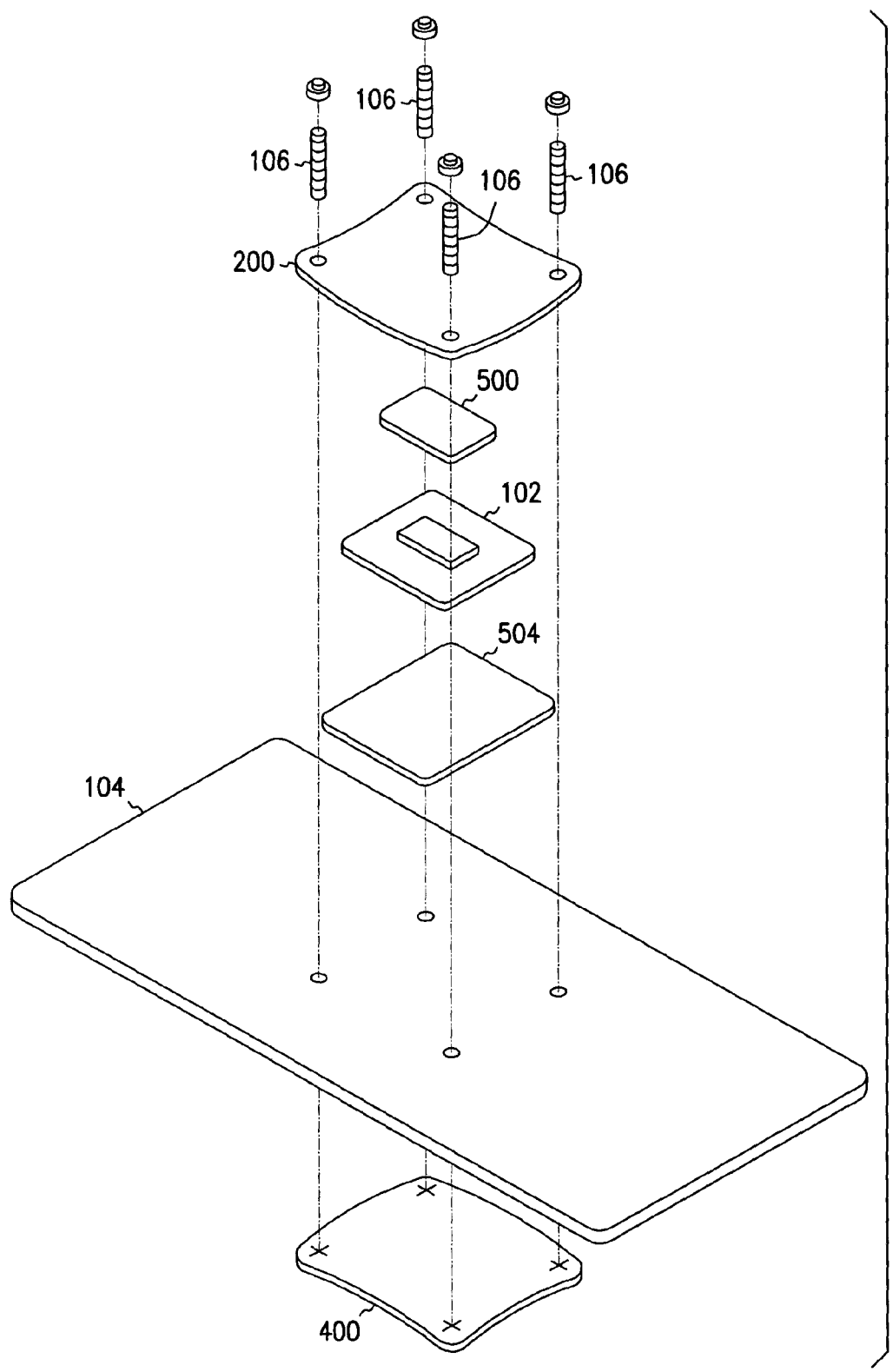
FIG. 8 shows an exploded view of one embodiment of the present invention.

As shown in FIG. 5, one or more of the pressure plate 200, the backing plate 400, or the gasket 500 may define one or more windows. A window is shown in the center of these parts in FIG. 5, but could be located elsewhere, and there could be multiple windows in any part. In FIG. 5, the windows expose the integrated circuit, but could expose any selected portion of the plates or circuit board 104. These windows can aid in testing or fitting additional parts in an electronic device. FIG. 8, an exploded view of one embodiment of the present invention, shows these parts without windows.

Figure 6:
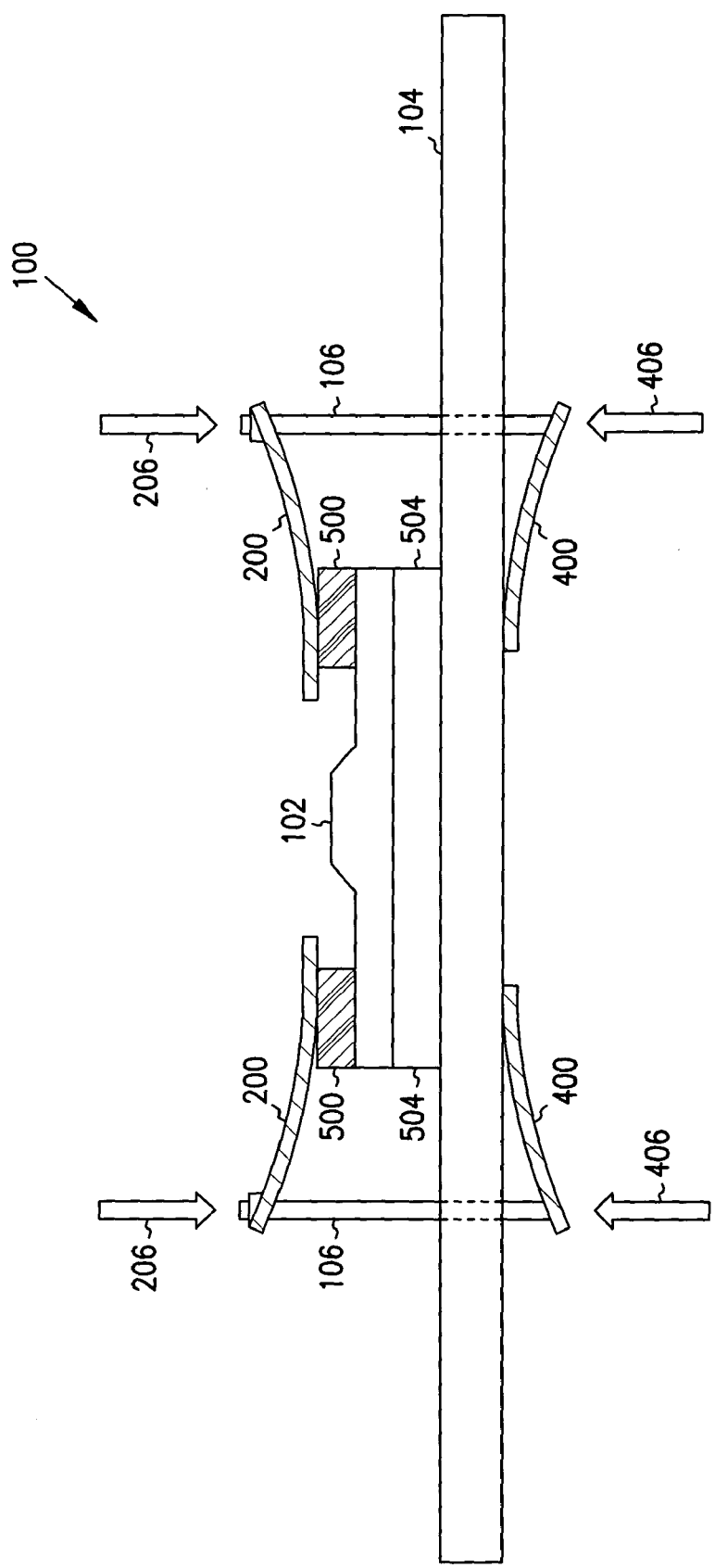
FIG. 6 shows a sectional view of one embodiment of the present invention.

FIG. 6 shows a sectional view of one embodiment of the present invention. In one embodiment, a retention mechanism 100 comprises a pressure plate 200, an integrated circuit package 102, a circuit board 104, a backing plate 400, and one or more fasteners 106. The retention mechanism 100 may further comprise a connector 504 and a gasket 500. The force 206 applied to the pressure plate 200 and the force 406 applied to the backing plate result in the continuous spring force retaining the sandwich together, is also shown in FIG. 5.

Referring back to FIG. 2, the pressure plate 200, in one embodiment, is a paraboloid, elastically deformable plate with a concave surface 208, a convex surface 210, a summit 202, and a periphery 204 spaced away from the summit 202. A paraboloid plate may be dish-shaped or slightly bowed. A dish-shaped plate is a paraboloid of revolution, i.e. in three dimensions. A slightly bowed plate is a paraboloid in two dimensions. While the shape may be a parabola or similar to one, it need not be and could be any simple curve, even circular, elliptic, hyperbolic, or the like, and may, as well, comprise any portion of any of these curves. The pressure plate 200 may be deformed by applying a force 206 to the periphery 204 directed generally towards the summit 202. The shape of the plate helps direct the force towards the summit 202, but the force itself may be applied generally downward.

Figure 7:
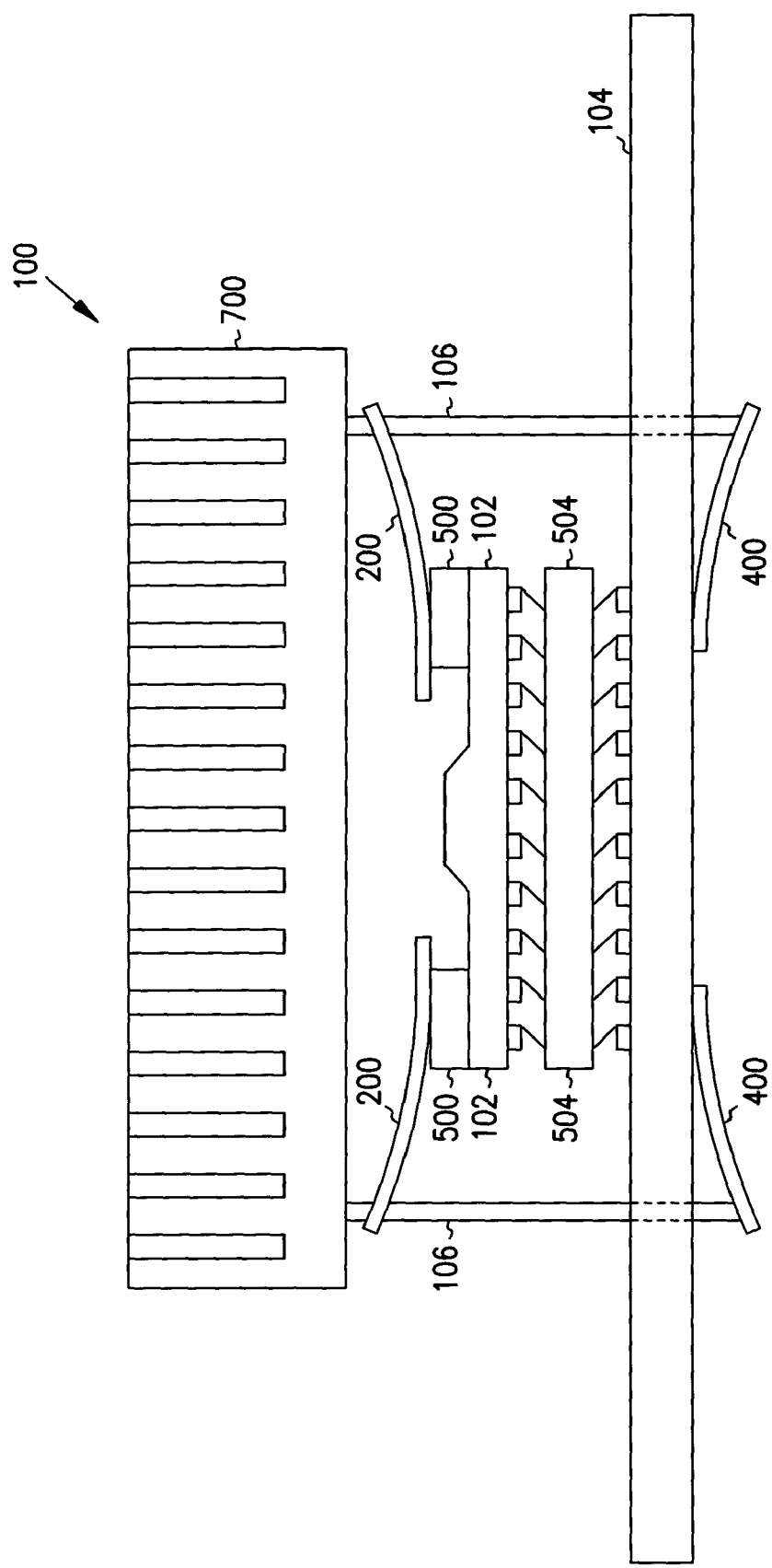
FIG. 7 shows a sectional view of another embodiment of the present invention.

FIG. 7 shows a sectional view of another embodiment of the present invention. A difference between FIG. 6 and FIG. 7 is the heat sink 700. In one embodiment, a heat sink 700 is in contact with the concave surface 208 of the pressure plate 200. In one embodiment, the retention mechanism 100 comprises a heat sink, a backing plate, and a means 106 for applying a deforming force without a pressure plate 200. If the integrated circuit package 102 includes an organic substrate, then both the pressure plate 200 and the backing plate need to be used, but if the integrated circuit package 102 is a rigid ceramic package, then the heat sink can be attached directly to the package. Another difference is the connector 504 has pins in FIG. 7 while it is pinless in FIG. 6.

In one embodiment, the height of the pressure plate 200 is less than about 2 millimeters, preferably less than about 1.5 millimeters. The height is measured from the summit of the pressure plate 200 to the periphery 204 of the pressure plate 200. The summit of the pressure plate 200 is located on the convex surface 210 of the pressure plate 200. The periphery 204 of the pressure plate 200 is located on the concave surface 208 of the pressure plate 200. (See FIG. 2). Similarly, in one embodiment, the height of the backing plate is also less than about 2 millimeters, preferably less than about 1.5 millimeters. The retention mechanism 100 is able to provide high forces, such as 70 pounds that are needed to achieve the low thermal resistance that today's devices need, but without the thick, heavy plates traditionally used. The thin pressure plate 200 and thin backing plate 400 provide a continuous spring force evenly distributed across the contacts of the electrical parts, even if a thermal interface material compresses. The bond-line thickness of thermal interface material is very susceptible to load variations. The retention mechanism 100 holds the pressure on the thermal interface material over the life of the product.

The integrated circuit package 102, in one embodiment, is sandwiched between the pressure plate 200 and the circuit board 104, so that its top surface is in contact with the convex surface 210 of the pressure plate 200 and its bottom surface is in contact with the circuit board 104. In another embodiment, the integrated circuit package 102 is sandwiched between the gasket 500 and the connector 504 so that its top surface is in contact with the gasket 500 and its bottom surface is in contact with the connector 504. This embodiment is shown in FIG. 6, including a gasket 500 and a connector 504. In one embodiment, the integrated circuit package 102 includes an organic land grid array. In another embodiment, the integrated circuit package 102 includes a flip chip pin grid array.

The circuit board 104, in one embodiment, is sandwiched between the integrated circuit package 102 and the backing plate 400, so that its top surface is in contact with the integrated circuit package 102 and its bottom surface is in contact with the backing plate 400. In another embodiment, the circuit board 104 is sandwiched in between the connector 504 and the backing plate 400, so that its top surface is in contact with the connector 504 and its bottom surface is in contact with the backing plate 400. This embodiment is shown in FIG. 6, including a connector 504.

The backing plate 400, in one embodiment, is a paraboloid, elastically deformable plate with a concave surface 408, a convex surface 410, a summit 402, and a periphery 404 spaced away from the summit 402. The pressure plate 200 may be deformed by applying a force 406 to the periphery 404 directed generally towards the summit. The force 406 on the backing plate 400 opposes the force 206 on the pressure plate 200.

One or more fasteners 106, in one embodiment, simultaneously apply the force 206 on the pressure plate 200 and the force 406 on the backing plate 400, deforming the plates. The forces engage the top surface of the integrated circuit package 102 with the convex surface 210 of the pressure plate 200 and the bottom surface of the circuit board 104 with the convex surface 410 of the backing plate 400. These forces deform the plates so as to effect continuous electrical continuity between the integrated circuit package 102 and the circuit board 104.

Another aspect of the present invention is an electronic assembly. An electronic system is broadly defined as any product comprising an electronic assembly. Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, Motion Picture Experts Group, Audio Layer 3 (MP3) players, etc.), and the like.

In one embodiment, an electronic assembly comprises a pressure plate 200, an integrated circuit package 102, a circuit board 104, a backing plate 400, and a means 106 for applying force to deform the plates. In one embodiment, the electronic assembly comprises a retention mechanism 100 retaining a sandwich having layers from top to bottom: a pressure plate 200, an integrated circuit package 102, a circuit board 104, and a backing plate 400. Each layer is in contact with the next, effecting continuous electrical continuity between the integrated circuit package 102 and the circuit board 104.

In another embodiment, the electronic assembly comprises a retention mechanism 100 retaining a sandwich having layers from top to bottom: a pressure plate 200, an integrated circuit package 102, a connector 504, a circuit board 104, and a backing plate 400. Each layer is in contact with the next, effecting continuous electrical continuity between the integrated circuit package 102 and the circuit board 104.

In another embodiment, the electronic assembly comprises a retention mechanism 100 retaining a sandwich having layers from top to bottom: a pressure plate 200, a gasket 500, an integrated circuit package 102, a connector 504, a circuit board 104, and a backing plate 400. Each layer is in contact with the next, effecting continuous electrical continuity between the integrated circuit package 102 and the circuit board 104.

Figure 9:
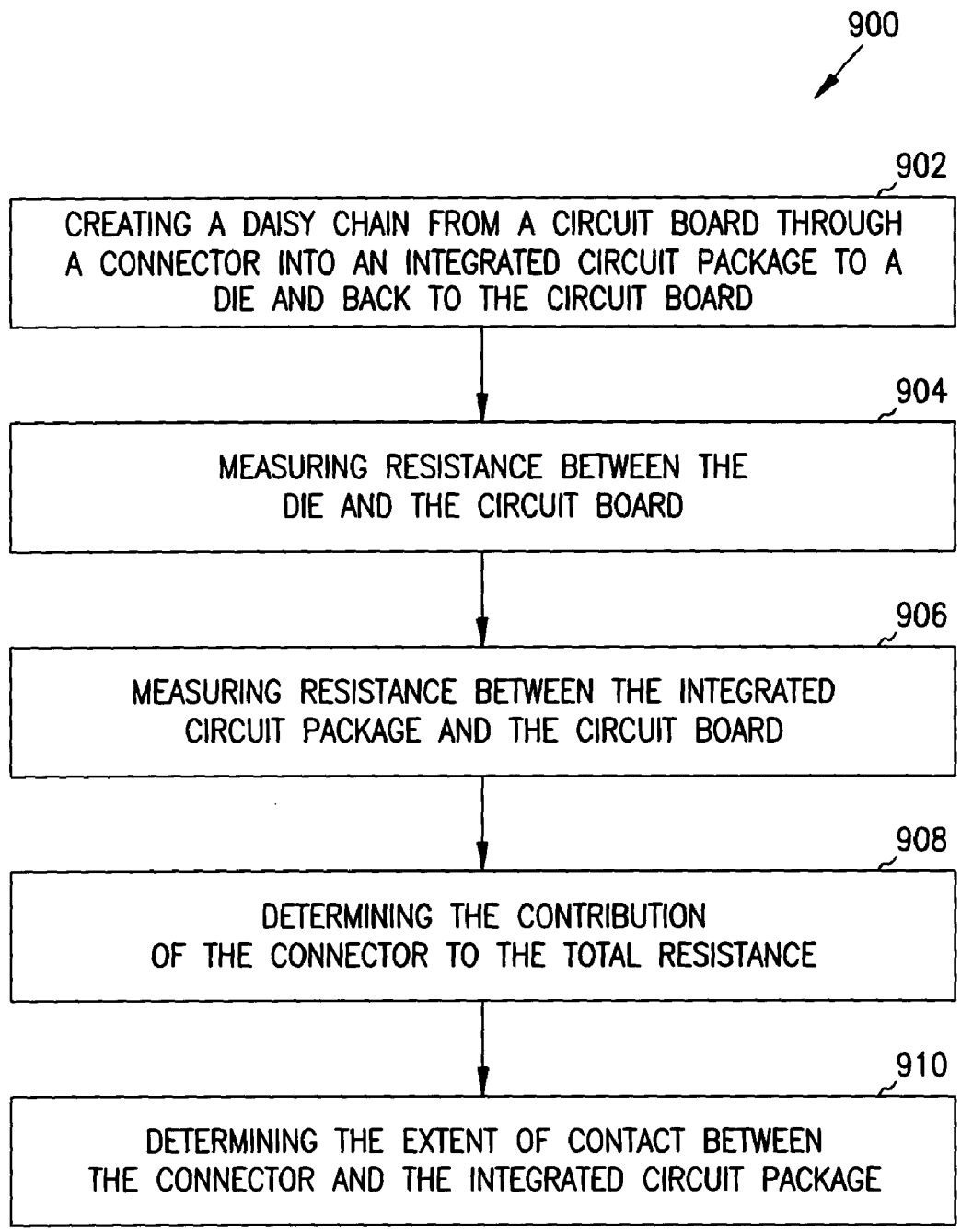
FIG. 9 shows a flowchart of one method of testing the present invention.

Another aspect of the present invention is a method of testing a retention mechanism. FIG. 9 shows a flowchart of one method of testing the present invention 900. The retention mechanism 100 is tested to assess the quality of the contact between the integrated circuit package 102 and the circuit board 104 or between the integrated circuit package 102 and the circuit board 104. During the test, resistance is measured using a chain called a daisy chain. To set up the test, in one embodiment, a cable goes through the circuit board 104, into the integrated circuit package 102, into the die, and back again to a different part of the circuit board 104. To set up the test, in another embodiment, a cable goes through the circuit board 104, through the connector 504, into the integrated circuit package 102, into the die, and back again through a different contact in the connector 504 and a different part of the circuit board 104. In one embodiment, a method of testing a retention mechanism 900 comprises: creating a daisy chain from a circuit board through a connector into a integrated circuit package to a die and back to the circuit board 902 and measuring resistance between the die and the circuit board 904. In another embodiment, the test includes measuring the resistance between the integrated circuit package and the circuit board 906. In one embodiment, the method of testing 900 further comprises determining the contribution of the connector to the total resistance 908 and determining the extent of contact between the connector and the integrated circuit package 910. In testing the retention mechanism 100, contact was achieved in all the daisy chains and a very low average contact resistance of about 13 milliohms was measured.

Figure 10:
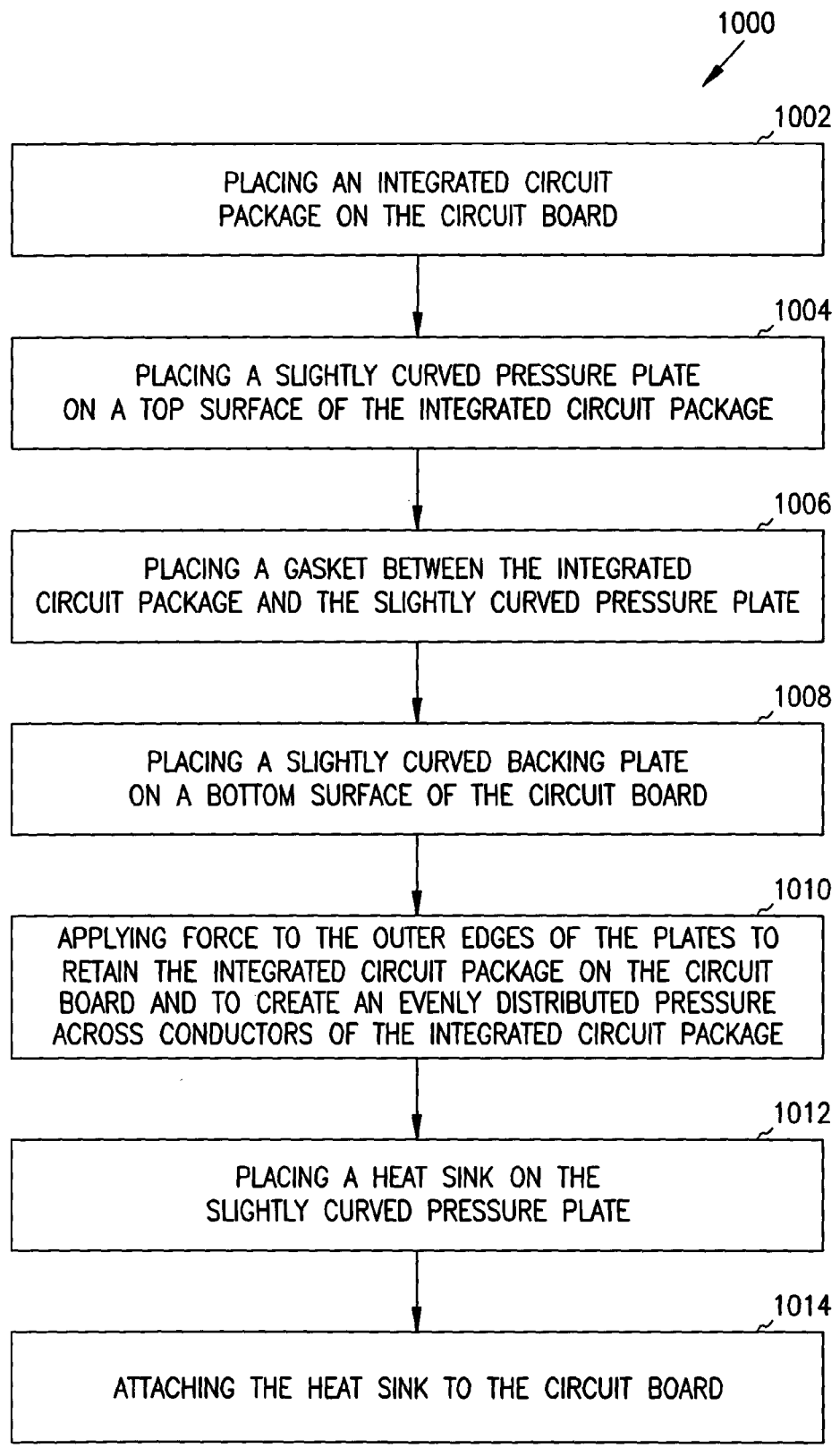
FIG. 10 shows a flowchart of one method of assembling the present invention.

Another aspect of the present invention is a method of assembling a retention mechanism. FIG. 10 shows a flowchart of one method of assembling the present invention 1000. In one embodiment, the method 1000 comprises: placing an integrated circuit package on a circuit board 1002, placing a slightly curved pressure plate on a top surface of the integrated circuit package 1004, placing a slightly curved backing plate on a bottom surface of the circuit board 1008, and applying force to outer edges of the plates to retain the integrated circuit package on the circuit board and to create an evenly distributed pressure across conductors of the integrated circuit package 1010. In another embodiment, the method 1000 further comprises placing a heat sink on the slightly curved pressure plate 1012 and attaching the heat sink to the circuit board 1014. In another embodiment, the method 1000 further comprises placing a gasket between the integrated circuit package and the slightly curved pressure plate 1006.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A retention mechanism for mounting an integrated circuit package to a circuit board, comprising:
 a dish-shaped elastically deformable pressure plate, having a first apex and a first periphery spaced away from the first apex, the pressure plate being deformable by applying a first force to the first periphery directed generally towards the first apex;
 a dish-shaped elastically deformable backing plate, having a second apex and a second periphery spaced away from the second apex, the backing plate being deformable by applying a second force to the second periphery directed generally towards the second apex, wherein the backing plate is in contact with the circuit board, wherein the circuit board has a back side, and wherein the second periphery is to enable a plurality of components to be attached to the back side of the circuit board, after the integrated circuit package has been mounted to the circuit board; and
 means for simultaneously applying the first and second deforming forces to the first and second peripheries to engage the first apex with a surface of the integrated circuit package and the second apex with a surface of the circuit board so as to effect continuous electrical continuity between the integrated circuit package and the circuit board.

2. The retention mechanism of claim 1 further comprising an elastically deformable gasket positioned between the pressure plate and the integrated circuit package.

3. The retention mechanism of claim 1, wherein one or more of the pressure plate, the backing plate, or the gasket define one or more windows to expose one or more selected portions of the plates or the circuit board.

4. A retention mechanism comprising:
 an elastically deformable paraboloid pressure plate, having a concave surface, a convex surface, a summit, and a periphery spaced away from the summit, the pressure plate being deformable by applying a first force to the periphery directed generally towards the summit;
 an integrated circuit package having a top and a bottom surface, the convex surface of the pressure plate being contactable by the top surface of the integrated circuit package;
 a circuit board having a top and a bottom surface, the bottom surface of the integrated circuit package being contactable by the top surface of the circuit board; and
 an elastically deformable paraboloid backing plate, having a concave surface, a convex surface, a summit, and a periphery spaced away from the summit, the backing plate being deformable by applying a second force, opposing the first force, to the periphery of the backing plate directed generally towards the summit of the backing plate, the bottom surface of the circuit board being contactable by the convex surface of the backing plate; and
 one or more fasteners to simultaneously apply the first and second deforming forces to the peripheries of the plates
  to engage the top surface of the integrated circuit package with the convex surface of the pressure plate and the bottom surface of the circuit board with the convex surface of the backing plate and
  to deform the plates so as to effect continuous electrical continuity between the integrated circuit package and the circuit board the mechanism further comprising a connector interposed between the integrated circuit package and the circuit board.

5. The retention mechanism of claim 4 wherein the connector has a height less than about 2 millimeters.

6. The retention mechanism of claim 4 wherein the integrated circuit package is pinless and the connector is without pin holes.

7. The retention mechanism of claim 4 wherein the height from the summit to the periphery is less than about 1.5 millimeters.

8. The retention mechanism of claim 4 wherein the summit of the backing plate is located on the concave surface of the backing plate and the periphery of the backing plate is located on the convex surface of the backing plate, and the height from the periphery to the summit is less than about 2 millimeters.

9. The retention mechanism of claim 4 wherein the integrated circuit package includes an organic land grid array.

10. The retention mechanism of claim 4 wherein the integrated circuit package includes a flip chip pin grid array.

11. The retention mechanism of claim 4 further comprising a heat sink in contact with the concave surface of the pressure plate.

12. The retention mechanism of claim 5 wherein the connector has a height less than about 1 millimeter.

13. The retention mechanism of claim 8 wherein the height from the periphery to the summit is less than about 1.5 millimeters.

14. An electronic assembly comprising:
 an elastically deformable paraboloid pressure plate, having a concave surface, a convex surface, a summit, and a periphery spaced away from the summit, the pressure plate deformed by first force applied to the periphery directed generally towards the summit;
 an integrated circuit package having a top and a bottom surface, the top surface in contact with the convex surface of the pressure plate;
 a circuit board having a top and a bottom surface, the top surface of the circuit board in contact with the bottom surface of the integrated circuit package; and
 an elastically deformable paraboloid backing plate, having a concave surface, a convex surface, a summit, and a periphery spaced away from the summit, the backing plate deformed a second force, opposing the first force, applied to the periphery of the backing plate directed generally towards the summit of the backing plate, the convex surface of the backing plate in contact with the bottom surface of the circuit board; and
 means for simultaneously applying the first and second deforming forces to the periphery of the pressure plate and the periphery of the backing plate
  to engage the convex surface of the pressure plate with the top surface of the integrated circuit package and the convex surface of the backing plate with the bottom surface of the circuit board and
  to deform the plates so as to effect continuous electrical continuity between the integrated circuit package and the circuit board the mechanism further comprising a connector interposed between the integrated circuit package and the circuit board.

15. The electronic assembly of claim 14 further comprising an elastically deformable gasket interposed between the pressure plate and the integrated circuit package.

* * * * *